(12) United States Patent
Raghu et al.

(10) Patent No.: US 8,283,258 B2
(45) Date of Patent: Oct. 9, 2012

(54) SELECTIVE WET ETCHING OF HAFNIUM ALUMINUM OXIDE FILMS

(75) Inventors: Prashant Raghu, Boise, ID (US); Yi Yang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 893 days.

(21) Appl. No.: 11/839,628

(22) Filed: Aug. 16, 2007

(65) Prior Publication Data

US 2009/0047790 A1 Feb. 19, 2009

(51) Int. Cl.
*H01L 21/302* (2006.01)

(52) U.S. Cl. ........ 438/745; 438/750; 438/754; 216/102; 216/103

(58) Field of Classification Search ................ 438/745, 438/756, 750, 754; 216/83, 102, 103; 252/79.2
See application file for complete search history.

(56) References Cited

U.S. PATENT DOCUMENTS

| | | |
|---|---|---|
| 4,877,647 A | 10/1989 | Klabunde |
| 5,482,656 A | 1/1996 | Hiraoka et al. |
| 5,538,655 A | 7/1996 | Fauteux et al. |
| 5,622,668 A | 4/1997 | Thomas |
| 5,948,470 A | 9/1999 | Harrison et al. |
| 6,103,632 A | 8/2000 | Kumar et al. |
| 6,111,323 A | 8/2000 | Carter et al. |
| 6,143,647 A | 11/2000 | Pan et al. |
| 6,156,149 A | 12/2000 | Cheung et al. |
| 6,200,909 B1 | 3/2001 | Torek et al. |
| 6,403,382 B1 | 6/2002 | Zhu et al. |
| 6,423,465 B1 | 7/2002 | Hawker et al. |
| 6,503,841 B1 | 1/2003 | Criscuolo |
| 6,548,830 B1 | 4/2003 | Noguchi et al. |
| 6,565,763 B1 | 5/2003 | Asakawa |
| 6,566,248 B1 | 5/2003 | Wang et al. |
| 6,569,528 B2 | 5/2003 | Nam et al. |
| 6,569,774 B1 | 5/2003 | Trapp |
| 6,689,473 B2 | 2/2004 | Guire et al. |
| 6,746,825 B2 | 6/2004 | Nealey et al. |
| 6,781,166 B2 | 8/2004 | Lieber et al. |
| 6,890,624 B1 | 5/2005 | Kambe et al. |
| 6,890,703 B2 | 5/2005 | Hawker et al. |
| 6,924,341 B2 | 8/2005 | Mays |
| 6,926,953 B2 | 8/2005 | Nealey et al. |
| 6,949,456 B2 | 9/2005 | Kumar |
| 6,989,426 B2 | 1/2006 | Hu et al. |

(Continued)

FOREIGN PATENT DOCUMENTS

CN 1562730 1/2005

(Continued)

OTHER PUBLICATIONS

Nguyen, N.V.; Sayan S.; Levin, I.; Ehrstein, J.R.; Baumvol, I.J.R.; Driemeier, C.; Krug, C.; Wielunski, L.; Hung, P.Y.; Diebold, Alain. Optical band gaps and composition dependence of hafnium-aluminate thin films grown by atomic layer chemical vapor deposition. J. Vac. Sci. Technol. A 23(6) Nov./Dec. 2005.*

(Continued)

*Primary Examiner* — Binh X Tran
(74) *Attorney, Agent, or Firm* — TraskBritt

(57) ABSTRACT

Methods and etchant compositions for wet etching to selectively remove a hafnium aluminum oxide ($HfAlO_x$) material relative to silicon oxide ($SiO_x$) are provided.

22 Claims, 2 Drawing Sheets

U.S. PATENT DOCUMENTS

| | | | |
|---|---|---|---|
| 6,992,115 B2 | 1/2006 | Hawker et al. | |
| 7,030,495 B2 | 4/2006 | Colburn et al. | |
| 7,037,744 B2 | 5/2006 | Colburn et al. | |
| 7,045,851 B2 | 5/2006 | Black et al. | |
| 7,056,455 B2 | 6/2006 | Matyjasewski et al. | |
| 7,056,849 B2 | 6/2006 | Wan et al. | |
| 7,115,995 B2 | 10/2006 | Wong | |
| 7,118,784 B1 | 10/2006 | Xie | |
| 7,132,370 B2 | 11/2006 | Paraschiv | |
| 7,135,421 B2 | 11/2006 | Ahn et al. | |
| 7,135,523 B2 | 11/2006 | Ho et al. | |
| 7,163,712 B2 | 1/2007 | Chilkoti et al. | |
| 7,172,953 B2 | 2/2007 | Lieber et al. | |
| 7,186,613 B2 | 3/2007 | Kirner | |
| 7,189,430 B2 | 3/2007 | Ajayan et al. | |
| 7,189,435 B2 | 3/2007 | Tuominen et al. | |
| 7,190,049 B2 | 3/2007 | Tuominen et al. | |
| 7,202,308 B2 | 4/2007 | Boussand et al. | |
| 7,211,492 B2 | 5/2007 | Forbes et | |
| 7,291,284 B2 | 11/2007 | Mirkin et al. | |
| 2003/0091752 A1 | 5/2003 | Nealey et al. | |
| 2003/0100822 A1 | 5/2003 | Lew et al. | |
| 2003/0178707 A1 | 9/2003 | Abbott et al. | |
| 2003/0185741 A1 | 10/2003 | Matyjaszewski | |
| 2003/0235985 A1* | 12/2003 | Christenson et al. | 438/689 |
| 2004/0124092 A1 | 7/2004 | Black et al. | |
| 2004/0127001 A1 | 7/2004 | Colburn | |
| 2004/0142578 A1 | 7/2004 | Wiesner et al. | |
| 2004/0209194 A1* | 10/2004 | Kume et al. | 430/313 |
| 2004/0222415 A1 | 11/2004 | Chou | |
| 2004/0254317 A1 | 12/2004 | Hu | |
| 2004/0256615 A1 | 12/2004 | Sirringhaus et al. | |
| 2004/0265548 A1 | 12/2004 | Ho et al. | |
| 2005/0019498 A1* | 1/2005 | Osawa | 427/331 |
| 2005/0062165 A1 | 3/2005 | Saenger et al. | |
| 2005/0067704 A1* | 3/2005 | Kaneko et al. | 257/758 |
| 2005/0074706 A1 | 4/2005 | Bristol | |
| 2005/0100830 A1 | 5/2005 | Xu et al. | |
| 2005/0124135 A1 | 6/2005 | Ayazi et al. | |
| 2005/0145959 A1* | 7/2005 | Forbes et al. | 257/412 |
| 2005/0208752 A1 | 9/2005 | Colburn et al. | |
| 2005/0227473 A1* | 10/2005 | Iiara et al. | 438/607 |
| 2005/0238889 A1 | 10/2005 | Iwamoto | |
| 2005/0250053 A1 | 11/2005 | Marsh et al. | |
| 2005/0272341 A1 | 12/2005 | Colburn et al. | |
| 2006/0014001 A1 | 1/2006 | Zhang et al. | |
| 2006/0046079 A1 | 3/2006 | Lee | |
| 2006/0062867 A1 | 3/2006 | Choi | |
| 2006/0078681 A1 | 4/2006 | Hieda et al. | |
| 2006/7030495 | 4/2006 | Colburn | |
| 2006/0094199 A1 | 5/2006 | Kil et al. | |
| 2006/0105562 A1 | 5/2006 | Yi | |
| 2006/0124467 A1 | 6/2006 | Ho et al. | |
| 2006/0134556 A1 | 6/2006 | Nealey et al. | |
| 2006/0163646 A1 | 7/2006 | Black | |
| 2006/0192283 A1 | 8/2006 | Benson | |
| 2006/0205875 A1 | 9/2006 | Cha et al. | |
| 2006/0216888 A1* | 9/2006 | Zheng et al. | 438/257 |
| 2006/0217285 A1 | 9/2006 | Destarac | |
| 2006/0249784 A1 | 11/2006 | Black et al. | |
| 2006/0258159 A1 | 11/2006 | Colburn et al. | |
| 2006/0276048 A1 | 12/2006 | Raghu | |
| 2006/0278158 A1 | 12/2006 | Tolbert et al. | |
| 2006/0281266 A1 | 12/2006 | Wells | |
| 2007/0007602 A1 | 1/2007 | Oda et al. | |
| 2007/0020749 A1 | 1/2007 | Nealy et al. | |
| 2007/0023805 A1 | 2/2007 | Wells | |
| 2007/7172953 | 2/2007 | Lieber | |
| 2007/0045562 A1 | 3/2007 | Parekh | |
| 2007/0048674 A1 | 3/2007 | Wells | |
| 2007/0048941 A1 | 3/2007 | Tang et al. | |
| 2007/0048976 A1 | 3/2007 | Raghu | |
| 2007/0049045 A1 | 3/2007 | Zimmerman et al. | |
| 2007/0059929 A1* | 3/2007 | Cho et al. | 438/681 |
| 2007/0071881 A1 | 3/2007 | Chua et al. | |
| 2007/0072403 A1 | 3/2007 | Sakata | |
| 2007/0122932 A1 | 5/2007 | Kodas et al. | |
| 2007/0132004 A1 | 6/2007 | Yasuda et al. | |
| 2007/0145009 A1 | 6/2007 | Fucsko et al. | |
| 2007/0175859 A1 | 8/2007 | Black et al. | |
| 2007/0181870 A1 | 8/2007 | Libertino et al. | |
| 2007/0200477 A1 | 8/2007 | Tuominen et al. | |
| 2007/0208159 A1 | 9/2007 | McCloskey et al. | |
| 2007/0224819 A1 | 9/2007 | Sandhu | |
| 2007/0227383 A1 | 10/2007 | Decre et al. | |
| 2007/0249117 A1 | 10/2007 | Kang et al. | |
| 2008/0064220 A1* | 3/2008 | Fernandez et al. | 438/706 |
| 2008/0103256 A1 | 5/2008 | Kim et al. | |
| 2008/0164558 A1 | 7/2008 | Yang et al. | |

FOREIGN PATENT DOCUMENTS

| | | |
|---|---|---|
| EP | 0784543 | 4/2000 |
| EP | 1416303 A2 | 5/2004 |
| JP | 11080414 | 3/1999 |
| JP | 2005008882 | 1/2005 |
| JP | 2006036923 | 2/2005 |
| JP | 2006055982 | 3/2006 |
| TW | 256110 | 6/2006 |
| WO | 90/07575 | 7/1990 |
| WO | 97/06013 | 2/1997 |
| WO | 99/47570 | 9/1999 |
| WO | 02081372 | 10/2002 |
| WO | 2005/122285 A2 | 12/2005 |
| WO | 2006/076016 | 7/2006 |
| WO | 2006/078952 | 7/2006 |
| WO | 2007/019439 A3 | 2/2007 |
| WO | 2007/024241 | 3/2007 |
| WO | 2007/024323 A2 | 3/2007 |
| WO | 2007/055041 | 5/2007 |
| WO | 2008/091741 A2 | 7/2008 |
| WO | 2008/097736 A2 | 8/2008 |
| WO | 2008/124219 A2 | 10/2008 |

OTHER PUBLICATIONS

Cheng, Joy Y., et al., Nano Letters, vol. 6, No. 9, 2006, pp. 2009-2103.

Cheng, Joy Y., et al., Adv. Mater. 2003, vol. 15, No. 19, pp. 1599-1602.

Cheng, Joy Y., et al., Applied Physics Letters, 91, 143106-143106-3 (2007).

Niu, Sanjun, et al., Macromolecules, 36(7), 2428-2440, 2003 (web release date: Mar. 13, 2003) http://digitalcommons.uni.edu/cgi/viewcontent.cgi?article+1005&contect=chemeng_nanotechnology).

Parejo, Pilar Garcia, et al., J. Mater. Chem., 2006, 16, pp. 2165-2169.

Park, Cheolmin, et al., Polymer 44, 2003, 6725-6760.

Park, Miri, et al., Science, v. 276, No. 5317, p. 1401-1404, May 30, 1997.

Park, Sang-Min, et al., Adv. Mater., 2007, 19, pp. 607-611.

Park, Sung Chan, et al., Macromolecules 2007, vol. 40, No. 22, pp. 8119-8124.

Peters, Richard D., et al., J. Vac. Sci. Technol. B, vol. 18, No. 6, Nov./Dec. 2000, pp. 3530-3532.

Peters, Richard D., et al., Macromolecules, vol. 35, No. 5, 2002, pp. 1822-1834.

Potemkin, Igor I., et al., Macromol. Rapid Commun., 2007, 28, pp. 579-584.

Resnick, Douglas, J., et al., J. Microlith., Microfab., Microsyst., vol. 3, No. 2, Apr. 2004, pp. 316-321.

Ruiz, Ricardo, et al., Adv. Mater, 2007, 19, pp. 587-591.

Ryu, Du Yeol, et al., Macromolecules, vol. 40, No. 12, 2007, pp. 4296-4300.

Saraf, Ravi R., et al., Applied Physics Letters, vol. 80, No. 23, Jun. 10, 2002, pp. 4425-4427.

Shahrjerdi, Davood, et al., IEEE Electron Device Letters, vol. 28, No. 9, Sep. 2007, pp. 793-796.

Sharma, Sadhana, et al., Applied Surface Science, 206 (2003), pp. 218-229.

Sivaniah, E., et al., Macromolecules 2003, 36, pp. 5894-5896.

Sivaniah, et al., Macromolecules 2005, 38, 1837-1849.

Solak, Harun H., Journal of Physics D: Applied Physics, 2006, pp. R171-188.

Stoykovich, Mark P., et al., Science, vol. 308, Jun. 3, 2005, pp. 1442-1446.

Stoykovich, Mark P., et al., ACS Nano, vol. 1, No. 3, 2007, pp. 168-175.
Sundrani, Deepak, et al., Nano Lett., vol. 4, No. 2, 2004, pp. 273-276.
Sundrani, Deepak, et al., Langmuir 2004, vol. 20, No. 12, 2004, pp. 5091-5099.
Sigma-Aldrich, Tutorial regarding Materials for Lithography/Nanopatterning, http://www.sigmaaldrich.com/Area_of_Interest/Chemistry/Materials_Science/Micro_and_Nanoelectronic website, retrieved Aug. 27, 2007.
Van Poll, Maaike L., et al., Angew. Chem. Int. Ed. 2007, 46, pp. 6634-6637.
Winesett, D.A., et al., Langmuir 2003, 19, pp. 8526-8535.
Xu, Ting et al., Polymer 42, (2001) 9091-9095.
Wu, C.Y., et al., IEEE, 2007, pp. 153-154.
Yamaguchi, Toru, et al., Journal of Photopolymer Science and Technology, vol. 19, No. 3, 2006, pp. 385-388.
Yan, Xiaohu, et al., J. Am. Chem. Soc., vol. 126, No. 32, 2004, pp. 10059-10066.
Yang, Xiao M., et al., Macromolecules 2000, vol. 33, No. 26, 2000, pp. 9575-9582.
Yurt, Serkan, et al., Macromolecules 2006, vol. 39, No. 5, 2006.
Zhang, Mingfu, et al., Adv. Mater. 2007, 19, pp. 1571-1576.
Bae, Joonwon, "Surface Modification Using Photo-Crosslinkable Random Copolymers", Abstract submitted for the Mar. 2006 meeting of the American Physical Society, submitted Nov. 30, 2005.
Bang, Joona, "The Effect of Humidity on the Ordering of Tri-block Copolymer Thin Films," Abstract submitted for the Mar. 2007 meeting of the American Physical Society, submitted Nov. 20, 2006.
Bass, Robert B., et al., "Microcontact Printing with Octadecanethiol", Applied Surface Science, 226(4), pp. 335-340, Apr. 2004, http://www.ece.virginia.edu/UVML/sis/Papers/rbbpapers/assoct.pdf.
Bearinger, J.P., et al., Nature Materials 2, 259-264, 2003.
Black, C.T., IEEE 2005 Custom Integrated Circuits Conference, pp. 87-91.
Black, C.T., et al., IBM J. Res. & Dev., vol. 51, No. 5, Sep. 2007, pp. 605-633.
Black, Charles T., ACSNano, vol. 1, No. 3, 2007, American Chemical Society, pp. 147-150.
Black, Charles T., et al., IEEE Electronon Device Letters, vol. 25, No. 9, Sep. 2004, pp. 622-624.
Botelho do Rego, A.M., et al., Surface Science, 482-485 (2001), pp. 1228-1234.
Brydson, Rik M., et al. (chapter authors), "Generic Methodologies for Nanotechnology: Classification and Fabrication", Nanoscale Science and Technology, edited by R.W. Kelsall, et al., 2005 John Wiley & Sons, Ltd., (published online: Dec. 20, 2005) (http://www3.interscience.wiley.com/cgi-bin/summary/112217550/SUMMARY).
Canaria, Christi A., et al., "Formation and Removal of Alkylthiolate Self-Assembled Monolayers on Gold in Aqueous Solutions", Lab Chip 6, 289-295 (2006), http://www.rsc.org/publishing/journals/LC/article.asp?doi=b51066c) (Abstract).
Chandekar, Amol, et al., "Template-Directed Adsorption of block Copolymers on Alkanethiol-Patterned Gold Surfaces," (circa 2006), http://www.nano.neu.edutindustry/industiy_showcase/industry_day/documents/Chandekar.pdf) (Powerpoint template for scientific posters (Swarthmore College)).
Cheng, Joy T., et al., Nano Letters, vol. 0, No. 0, A-E, published on Web Aug. 16, 2006.
Daoulas Kostas Ch., et al., Physical Review Letters 96, week ending Jan. 27, 2006, pp. 036104-1-3.
Desai, Dr. Trejal A., et al., Business Briefing: Medical Device Manufacturing & Technology, 2002.
Edwards, Erik W., et al., Journal of Polymer Science: Part B Polymer Physics, vol. 43, 3444-3459, 2005.
Edwards, Erik W., et al., Advanced Mater, 16, No. 15, Aug. 4, 2004, pp. 1315-1319.
Fasolka, Michael J. et al., Macromolecules 2000, vol. 33, No. 15, pp. 5702-5712.
Gates, Byron D., et al., Annu. Rev. Mater. Res. 2004, 34:339-72.
Ge, Zhenbin, et al., PRL 96, 186101-1-186101-4, The American Physical Society, week ending May 12, 2006.
Genua, A., et al., Nanotechnology, 18 (2007), pp. 1-7.
Gillmor, S.D., et al., Langmuir 2000, vol. 16, No. 18, 2000, pp. 7223-7228.
Hamley, I. W., "Introduction to Block Copolymers", Developments in Block Copolymers Science and Technology, 2004, John Wiley & Sons, Ltd., pp. 1-29.
Hermans, Thomas M., et al., "Application of Solvent-Directed Assembly of Block Copolymers to the Synthesis of Nanostructured Materials with Low Dielectric Constants", Angewandte Chem. Int. Ed. 2006, 45, pp. 6648-6652.
Hutchison, J. Brian, et al., Chem. Mater., vol. 17, No. 19, 2005, pp. 4789-4797.
In, Insik, et al., Langmuir, vol. 22, No. 18, 2006, pp. 7855-7860.
Kim, Sang Ouk, et al., Nature, vol. 424, Jul. 24, 2003, pp. 411-414.
Kim, Sang Ouk, et al., Adv. Mater., 2007, 19, pp. 3271-3275.
Kim, Seung Hyun, et al., Macromolecules 2006, vol. 39, No. 24, 2006, pp. 8473-8479.
Kim, Seung Hyun, et al., Advanced Mater., vol. 16, No. 23-24, pp. 2119-2123, Dec. 17, 2004.
Krishnamoorthy, Sivashankar, et al., MaterialsToday, vol. 9, No. 9, Sep. 2006, pp. 40-47.
La, Young-Hye, et al., Chem. Mater, 2007, vol. 19, No. 18, pp. 4538-4544.
Laracuente, A.R., et al., Surface Science 545, 2003, pp. 70-84.
Lentz, David, et al., "Whole Wafer Imprint Patterning Using Step and Flash Imprint Lithography: A Manufacturing Solution for Sub 100 nm Patterning", SPIE Advanced Lithography Paper, http://molecularimprints.com/NewsEvents/tech_articles/new_articles/SPIE_07_MII_WW_Paper.pdf), Feb. 2007, pp. 1-10.
Li, Mingqi, et al., MaterialsToday, vol. 9, No. 9, Sep. 2006, pp. 30-39.
Li, Xue, et al., ScienceDirect, Polymer 48 (2007), pp. 2434-2443.
Lin, Zhiqun, et al., Adv. Mater. 2002, 14 No. 19, Oct. 2, pp. 1373-1376.
Lin-Gibson, Sheng, et al., Macromolecules 2005, 38, pp. 2897-2902.
Malkoch, Michael, et al., Chem. Commun., 2006, pp. 2774-2776.
Mansky, P., et al., Science, vol. 275, Mar. 7, 1997, pp. 1458-1460.
Maye, Mathew A., et al., Journal of Chemical Education, vol. 79, No. 2, Feb. 2002, pp. 207-210.
Metters, Andrew, et al., Biomacromolecules 2005, 6, pp. 290-301, 2005.
Meyer, Evelyn, et al., Macromollecular Mater. Eng., 276/277, 2000, pp. 44-50.
Mezzenga, Raffaele, et al., Langmuir 2003, vol. 19, No. 20, 2003, pp. 8144-8147.
Mindel, Joseph., et al., "A Study of Bredig Platinum Sols", The Chemical Laboratories of New York University, vol. 65 pp. 2112.
Mindel, Joseph., et al., "A Study of Bredig Platinum Sols", The Chemical Laboratories of New York University, vol. 65 pp. 2112, 1943.
Naito, et al., IEEE Transactions on Magnetics, vol. 38, No. 5, Sep. 2002, pp. 1949-1951.
Nealey, Paul F., et al., "Self-Assembling Resists for Nanolithography", IEEE 2005.
Nguyen, Kytai, et al., Biomaterials 23, 2002, pp. 4307-4314.
Christensen, Selective Wet Etching of Hlgh-k Materials, Solid State Technology online, Jul. 3, 2003, pp. 1-7, XP002361400.

* cited by examiner

SELECTIVE WET ETCHING OF HAFNIUM ALUMINUM OXIDE FILMS

TECHNICAL FIELD

Embodiments of the invention relate to etchant chemistries and methods of processing a substrate and semiconductor constructions.

BACKGROUND OF THE INVENTION

Conventionally, in a manufacturing process for a semiconductor device, openings such as contact holes are formed in dielectric layers by plasma etching using a patterned photoresist layer as a mask. However, as device sizes decrease, the size of features such as contact holes is reduced, requiring the replacement of conventionally used resist masks.

A hard mask formed of amorphous or transparent carbon has been used for dry etching of silicon oxide films, which offers high etch selectivity relative to a photoresist or other hard mask materials. However, the use of amorphous carbon as a mask is inapplicable for some processes when plasma etching silicon oxide, in part, because a sufficient selectivity of the silicon oxide film against the amorphous carbon mask cannot be obtained. In addition, etching features in silicon oxide that are 25 nm or less often requires the use of a very thick carbon film, which is generally not extendable for 25 nm patterning due to toppling of the mask structures, making a conventional amorphous carbon mask unsuitable.

It would be useful to provide processes that overcome these or related problems.

BRIEF DESCRIPTION OF THE DRAWINGS

Embodiments of the invention are described below with reference to the following accompanying drawings, which are for illustrative purposes only. Throughout the following views, the reference numerals will be used in the drawings, and the same reference numerals will be used throughout the several views and in the description to indicate same or like parts.

DETAILED DESCRIPTION OF THE INVENTION

The following description with reference to the drawings provides illustrative examples of devices and methods according to embodiments of the invention. Such description is for illustrative purposes only and not for purposes of limiting the same.

In the context of the current application, the term "semiconductor substrate" or "semiconductive substrate" or "semiconductive wafer fragment" or "wafer fragment" or "wafer" will be understood to mean any construction comprising semiconductor material, including but not limited to bulk semiconductive materials such as a semiconductor wafer (either alone or in assemblies comprising other materials thereon), and semiconductive material layers (either alone or in assemblies comprising other materials). The term "substrate" refers to any supporting structure including, but not limited to, the semiconductive substrates, wafer fragments or wafers described above.

Embodiments of the invention relate to the use of hafnium aluminum oxide ($HfAlO_x$) as a hard mask in etching silicon oxide, and solutions that provide etchant chemistry for selective removal of $HfAlO_x$ material from a structure relative to exposed doped and undoped silicon oxide materials including, but not limited to, silicon oxide deposited from tetraethylorthosilicate (TEOS), spin-on-glass (SOG), undoped $SiO_2$, phosphosilicate glass (PSG), borophosphosilicate glass (BPSG), and borosilicate glass (BSG). By "selectively" etching or removal of the $HFAlO_x$ material, it is meant that the etch is preferential to the $HfAlO_x$ material relative to adjacent or exposed silicon oxide with little or no etching of the silicon oxide, and that the $HfAlO_x$ material is etched at a rate greater than the silicon oxide. The compositions of the invention have increased selectivity to $HFAlO_x$ material in the presence of silicon oxide materials compared to conventional wet chemistries commonly used for removing $HfAlO_x$ material. The etchant solution can be used in applications for fabricating contact openings, word lines, digit lines, among other features and structures.

Figure 1:
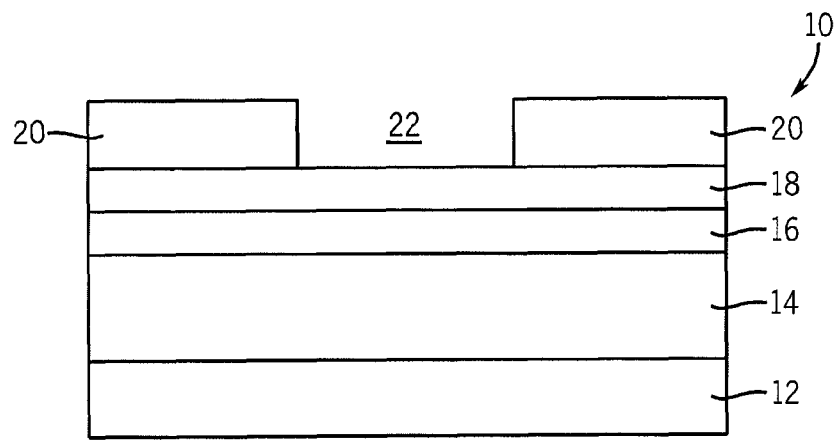
FIG. 1 illustrates a diagrammatic, cross-sectional view of a portion of a substrate at a preliminary processing stage according to an embodiment of the present disclosure.

An embodiment of a method according to the invention is illustrated with reference to FIGS. 1-6. FIG. 1 illustrates a substrate fragment indicated generally with reference to numeral 10 at a preliminary processing stage. The substrate fragment 10 in progress can comprise a semiconductor wafer substrate or the wafer along with various process layers formed thereon, including one or more semiconductor layers or other formations, and active or operable portions of semiconductor devices.

The substrate fragment 10 comprises a substrate 12, a dielectric (silicon oxide) layer 14 to be etched, a hafnium aluminum oxide ($HfAlO_x$) layer 16, a dielectric antireflective coating (DARC) layer 18, and a photoresist masking layer 20.

The substrate 12 is compositionally dissimilar to the silicon oxide layer 14, and can be composed of a silicon layer such as monocrystalline, polycrystalline or amorphous silicon, a doped silicon region, a nitride material (e.g., silicon nitride such as $Si_3N_4$, a refractory metal nitride such as titanium nitride (TiN), tungsten nitride (WN), etc.), a silicon oxide layer with different doping than a silicon oxide dielectric layer 14, a metal silicide such as titanium silicide ($TiSi_2$), a metal interconnect, or other material layer.

The dielectric layer 14 can be formed of undoped or doped silicon oxide ($SiO_x$), for example, silicon oxide deposited from tetraethylorthosilicate (TEOS), borophosphosilicate glass (BPSG), borosilicate glass (BSG), phosphosilicate glass (PSG), spin-on-glass (SOG), etc., in a single layer or multiple layers. In various embodiments, the dielectric ($SiO_x$) layer 14 will comprise, consist essentially of, or consist of silicon and oxygen. A typical thickness of the dielectric layer 14 is about 1,000-20,000 Å.

A hafnium aluminum oxide layer 16 ($Hf_xAl_yO_z$ or $HfAlO_x$ such as $HfAlO_3$), a high dielectric constant (high-k) material, replaces a conventional hard mask such as a carbon-based hard mask that is generally formed over a material to be etched. In embodiments of the invention, the $HFAlO_x$ layer 16 is formed as a hard mask over the dielectric ($SiO_x$) layer 14 by atomic layer deposition (ALD) processing with a concentration ratio of Hf:Al in the film at about 20:1 to about 4:1 (wt-%), or about 10:1 to about 8:1 (ALD deposition temperature of about 300° C). The thickness of the $HfAlO_x$ hard mask layer 16 is generally about 200-1,000 Å, or about 300-500 Å.

The $HFAlO_x$ hard mask layer 16 can be formed by ALD processing using known techniques in the art, for example, as described in U.S. Pat. No. 7,211,492 (Forbes et al.) and U.S. Pat. No. 7,135,421 (Ahn et al.), which are commonly assigned to Micron Technology, Inc., the disclosures of which are incorporated by reference herein. Briefly, the HfAlO$_x$ hard mask layer 16 can be formed using ALD processing by employing a hafnium sequence of pulsing a hafnium-containing precursor (e.g., HfCl$_4$) into a reaction chamber containing a substrate and pulsing a first oxygen-containing precursor (e.g., water vapor) into the reaction chamber as an oxidizing reactant to form hafnium oxide, and an aluminum sequence by pulsing an aluminum-containing precursor (e.g., trimethylaluminum, Al(CH$_3$)$_3$, or DMEAA, an adduct of alane (AlH$_3$) and dimethylethylamine (N(CH$_3$)$_2$(C$_2$H$_5$)), into the reaction chamber and pulsing a second oxygen containing precursor (e.g., distilled water vapor) into the reaction chamber as an oxidizing reactant to form a HfAlO$_x$ film. Each precursor is pulsed into the reaction chamber for a selected time period (pulse time), typically from about 0.5 seconds to about 2-3 seconds. Between each precursor pulsing, the reaction chamber is purged with an inert gas (e.g., nitrogen or argon) or evacuated to remove precursor excess and reaction by-products. The thickness of the HfAlO$_x$ film is controlled by repeating for a number of cycles the pulsing of the Hf-containing precursor, the first O-containing precursor, the Al-containing precursor, and the second O-containing precursor until the desired thickness is formed. In addition, the HfAlO$_x$ hard mask layer 16 can be engineered with selected characteristics by controlling precursor materials for each sequence, processing temperatures and pressures for each sequence, individual precursor pulsing times, and heat treatment at the end of the process, at the end of each cycle, and at the end of each sequence.

A dielectric antireflective coating layer (DARC) 18 overlies the HfAlO$_x$ hard mask layer 16 and is generally a silicon oxynitride (Si$_x$O$_y$N$_z$, e.g., where x=10-60, y=20-50, z=10-20, for example, Si$_{50}$O$_{37}$N$_{13}$). The DARC layer 18 can serve as an intermediate hard mask to reduce light reflections during lithography. The DARC layer 18 can be deposited onto the HfAlO$_x$ hard mask layer 16 by known processes, such as chemical vapor deposition (CVD) or plasma enhanced CVD (PECVD) including, for example, electron cyclotron resonance (ECR) PECVD, and bias ECR PECVD processes, for example, using a feed gas that comprises SiH$_4$, N$_2$, O$_2$, and argon. A typical thickness of the DARC layer 18 is about 200-1,000 Å, or about 300-400 Å.

A photoresist mask layer 20, typically an organic polymeric material (e.g., a novolac resin), is formed over the DARC layer 18 and, as depicted, exposed and developed using conventional photolithographic techniques as known in the art, to provide a desired pattern with openings 22 that expose portions of the DARC layer 18.

Figure 2:
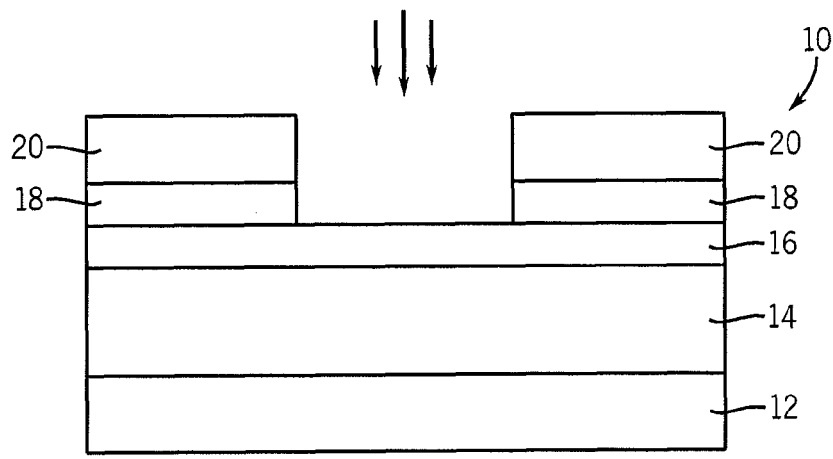
FIGS. 2-6 are cross-sectional views of the substrate depicted in FIG. 1 at subsequent processing stages.

The pattern in the photoresist mask layer 20 can be transferred to the DARC layer 18 by a standard dry etch (arrows 111) using, for example, a fluorine-based gas plasma chemistry to expose the underlying HFAlO$_x$ hard mask layer 16, as shown in FIG. 2.

Figure 3:
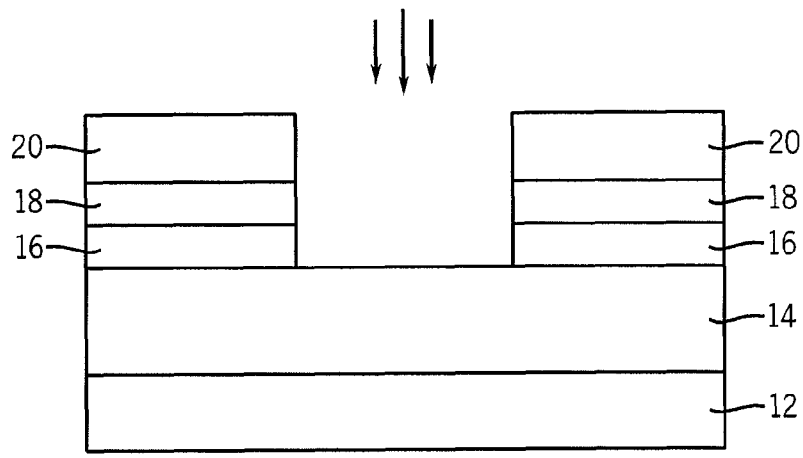

Then, as illustrated in FIG. 3, the HFAlO$_x$ hard mask layer 16 can be dry etched (arrows 111) using a standard chemistry to expose portions of the silicon oxide layer 14. An etchant gas is used, for example, a mixture of boron trichloride (BCl$_3$) and chlorine (Cl$_2$) gases, which provides good selectivity to etch HfAlO$_x$ and stop on TEOS or other silicon oxide material (e.g., substrate 12).

Figure 4:
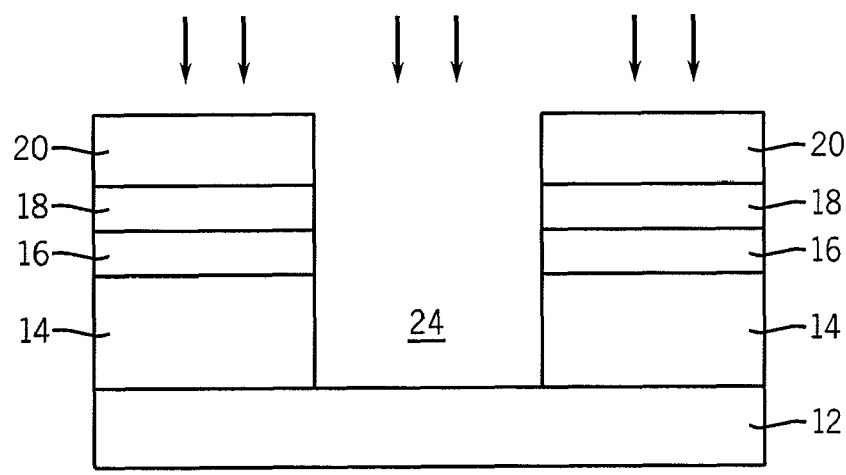

Referring now to FIG. 4, the dielectric (SiO$_x$) layer 14 is then dry etched to form a contact opening 24 (i.e., contact hole, via, or other opening such as a trench) extending to the underlying substrate layer 12 for forming, for example, a contact hole for an interconnect level, a gate electrode, a capacitor electrode, a via, etc. A silicon oxide dry etch can be conducted according to known methods using a standard fluorocarbon-based dry etch chemistry (e.g., CF$_4$, CHF$_3$, CH$_2$F$_2$, CH$_3$F, C$_2$F$_6$, C$_3$F$_8$, C$_4$F$_6$, etc.). Typically, the contact opening 24 is etched to a high aspect ratio of about 1:1 to about 20:1 with a width of about 15-65 nm and a depth of about 100 nm-2,000 nm, for example.

Figure 5:
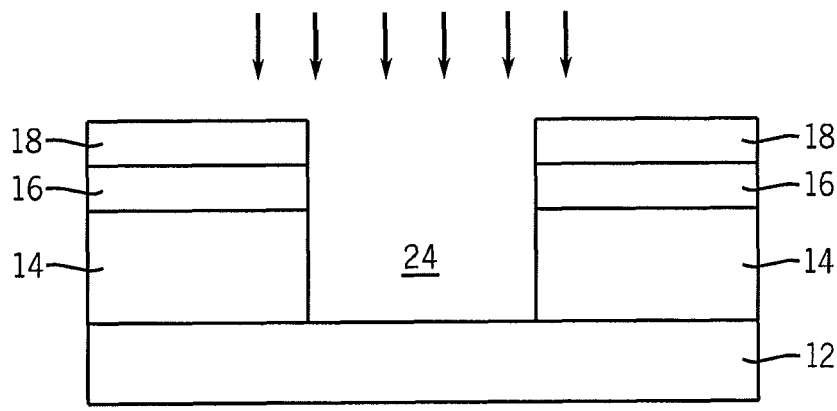

After the etch of the contact opening 24 is completed, the photoresist mask layer 20 is selectively removed (dry stripped) as shown in FIG. 5, for example, by a standard dry etch process using an oxygen (O$_2$) plasma ashing step.

Figure 6:
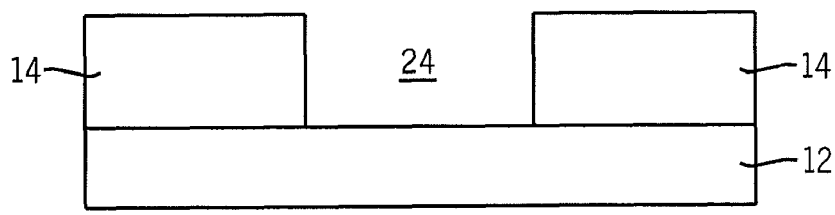

Then, in accordance with the invention, the DARC layer 18 and the HfAlO$_x$ hard mask layer 16 are removed (stripped) selective to the dielectric (SiO$_x$) layer 14 and the substrate 12, as illustrated in FIG. 6.

Conventional processes for removing HfAlO$_x$ (and DARC) materials typically use hydrofluoric acid (HF) based chemistries, e.g., a dilute HF/water wet etch. However, standard dilute HF etch chemistries are not selective to and will attack and rapidly etch silicon oxides such as BPSG, PSG and TEOS. This necessitates the use of different etch chemistries for stripping HfAlO$_x$ materials in the presence of oxides.

The etchant compositions of the invention are aqueous solutions of phosphoric acid (H$_3$PO$_4$) and water (H$_2$O) that etch HfAlO$_x$ material selective to silicon oxide (e.g., BPSG, PSG, TEOS, etc.). Embodiments of the etchant compositions are formulated with a H$_3$PO$_4$:H$_2$O volume ratio of about 50:50 to about 90:10, or about 80:20 to about 85:15, based on the total volume of the solution. A temperature range of about 100-185° C. is typical for most applications. The H$_3$PO$_4$:H$_2$O etchant compositions are maintained at a pH level <2, which can be manipulated by adding an additional acid such HCl, H$_2$SO$_4$, HNO$_3$, HCOOH and CH$_3$COOH, among others. In some embodiments, the etchant composition consists essentially of or consists of phosphoric acid and water, optionally with an additional acid in a minor but effective amount to modify the pH of the solution.

The H$_3$PO$_4$/H$_2$O etchant solution can be applied to the material layers, e.g., the HfAlO$_x$ layer 16 and DARC layer 18, to be stripped in various ways. For example, the etchant solution can be sprayed onto the substrate 10, or the substrate can be dipped or immersed into a bath of the etchant solution (e.g., a megasonic bath), or the etchant solution can be flowed over the substrate, among other applications.

The H$_3$PO$_4$/H$_2$O etchant compositions provide a wet etch of HfAlO$_x$ (about 10:1 Hf:Al ratio) and DARC materials selective to the SiO$_x$ material layer 14 at an etch rate (or selectivity) of greater than 1, or an etch selectivity of about 2:1 to about 20:1 (HfAlO$_x$:SiO$_x$), with little or no etching of the SiO$_x$ layer. Etchant compositions having a H$_3$PO$_4$:H$_2$O volume ratio of about 50:50 to about 90:10 (temperature of about 100-185° C.) provide an etch of ALD HfAlO$_x$ (Hf:Al ratio of about 20:1 to about 4:1) at a rate about 50-400 Å/minute, an etch of a DARC material layer 18 at a rate of about 5-40 Å/minute or about 20-40 Å/minute, and minimal etching of a SiO$_x$ material layer 14 at about 5-40 Å/minute or about 5-15 Å/minute. For example, the application of an etchant solution of H$_3$PO$_4$:H$_2$O at a ratio of about 80:20 to about 85:15 (v/v) (temperature of about 100-185° C.) will etch ALD HfAlO$_x$ (about 10:1 Hf:Al ratio) at an etch selectivity of about 8:1 to about 12:1. The application of an about 10:1 (v/v) H$_3$PO$_4$:H$_2$O etchant solution at about 145° C. will provide an etch of an ALD HfAlO$_x$ film 16 (about 10:1 Hf:Al ratio) at a rate of about 300 Å/minute.

Materials such as PSG, TiN, Si$_x$N$_y$, etc., can be exposed as the substrate layer 12 or at different levels in a material stack during the wet etch of the HfAlO$_x$ material layer 16. The H$_3$PO$_4$:H$_2$O etchant compositions have a selectivity (or etch rate) to PSG of about 10:1 (HfAlO$_x$:PSG), a selectivity to titanium nitride (TiN) of about 43:1 (HfAlO$_x$:TiN), and a selectivity to silicon nitride (Si$_x$N$_y$, e.g., such as Si$_3$N$_4$) of about 6:1 (HfAlO$_x$:Si$_x$N$_y$).

The etchant solution can be used in applications for fabricating contact openings as illustrated, or other features such as word lines, digit lines, etc. The substrate 10 can then undergo post-etch processing steps that are known in the art to fabricate desired components. For example, the resulting contact openings 24 can be further processed, for example, by filling with a metal or conductive material such as copper, aluminum, silicon, Ti$_3$N$_4$, among others, to form contacts or conductive lines, for example, to an underlying active area, contact, or conductive line, or with a metal-insulator-metal-stack to form capacitors with a dielectric material such as Al$_2$O$_3$, HfO$_2$, ZrO$_2$, SrTiO$_3$, and the like, in the fabrication of integrated circuit devices such as memory devices. Finished semiconductor wafers can be cut into dies, which may then be further processed into integrated circuit chips and incorporated in electronic devices.

Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations that operate according to the principles of the invention as described. Therefore, it is intended that this invention be limited only by the claims and the equivalents thereof The disclosures of patents, references and publications cited in the application are incorporated by reference herein.

What is claimed is:

1. A method of etching a DARC material and hafnium aluminum oxide material in the presence of exposed silicon oxide material, the DARC material overlying and in contact with the hafnium aluminum oxide material, the method comprising:
    applying an etchant solution to the DARC material and the hafnium aluminum oxide material to selectively etch the DARC material and the hafnium aluminum oxide material at a rate greater than the silicon oxide material;
    wherein the etchant solution consists essentially of phosphoric acid and water and optionally a pH modifying acid such that the etchant solution has a pH of less than 2.

2. The method of claim 1, wherein a volume ratio of a total amount of the phosphoric acid to water is about 50:50 to about 90:10.

3. The method of claim 1, wherein a volume ratio of a total amount of the phosphoric acid to water is about 80:20 to about 85:15.

4. The method of claim 1, wherein the hafnium aluminum oxide material is etched at rate of about 50-400 Å/minute, and the silicon oxide material is etched at rate of about 5-400 Å/minute.

5. The method of claim 1, wherein the etchant solution has a selectivity of hafnium aluminum oxide to silicon oxide of about 2:1 to about 20:1.

6. The method of claim 1, wherein the etchant solution has a temperature of about 100° C.-185° C.

7. The method of claim 1, wherein the hafnium aluminum oxide material has a Hf:Al ratio of about 20:1 to about 4:1.

8. The method of claim 1, wherein the silicon oxide is an oxide selected from the group consisting of tetraethylorthosilicate, spin-on-glass, undoped SiO$_2$, phosphosilicate glass, borophosphosilicate glass, and borosilicate glass.

9. The method of claim 1, wherein the hafnium aluminum oxide material is etched relative to the silicon oxide at an etch selectivity of about 8:1 to about 12:1 hafnium aluminum oxide material to silicon oxide material.

10. A method of etching a DARC material and hafnium aluminum oxide material in the presence of exposed silicon oxide material, the DARC material overlying and in contact with the hafnium aluminum oxide material, the method comprising:
    applying an etchant solution to the DARC material and the hafnium aluminum oxide material to etch the DARC and hafnium aluminum oxide materials at a rate greater than the silicon oxide material;
    wherein the etchant solution consists essentially of phosphoric acid and water.

11. The method of claim 10, wherein the hafnium aluminum oxide material is etched at rate of about 50-400 Å/minute, the DARC material is etched at rate of about 20-40 Å/minute, and the silicon oxide material is etched at rate of about 5-15 Å/minute.

12. The method of claim 10, wherein the etchant solution has a selectivity of hafnium aluminum oxide to silicon oxide of about 2:1 to about 20:1.

13. A method of forming a semiconductor device, comprising:
    etching a hafnium aluminum oxide layer and a DARC layer through a patterned photoresist mask to expose a silicon oxide layer, the DARC layer overlying and in contact with the hafnium aluminum oxide layer;
    etching the silicon oxide layer to form an opening extending to a substrate;
    removing the patterned photoresist mask to expose the DARC layer; and
    applying an etchant solution consisting essentially of phosphoric acid and water to selectively etch the hafnium aluminum oxide and DARC layers at a rate greater than the silicon oxide.

14. A method of forming a semiconductor device, comprising:
    forming a hafnium aluminum oxide layer over a silicon oxide layer situated on a substrate;
    forming a DARC layer over the hafnium aluminum oxide layer;
    forming a patterned photoresist layer over the DARC layer to expose the DARC layer;
    etching the hafnium aluminum oxide and DARC layers through the patterned photoresist layer to expose the silicon oxide layer;
    etching the silicon oxide layer to form an opening extending to the substrate;
    removing the patterned photoresist layer to expose the DARC layer; and
    applying an etchant solution consisting essentially of phosphoric acid and water to selectively remove the hafnium aluminum oxide and DARC layers at a rate greater than the silicon oxide.

15. The method of claim 14, wherein the hafnium aluminum oxide layer is formed by atomic layer deposition, and the hafnium aluminum oxide material has a Hf:Al ratio of about 20:1 to about 4:1.

16. A method of forming a semiconductor device, comprising:
    etching hafnium aluminum oxide and DARC layers through a patterned photoresist layer to expose a silicon oxide layer, the DARC layer overlying and in contact with the hafnium aluminum oxide layer;
    etching the silicon oxide layer to form an opening extending to an underlying substrate;

removing the patterned photoresist layer to expose the DARC layer; and applying an etchant solution consisting essentially of phosphoric acid and water to selectively remove the hafnium aluminum oxide and DARC layers at a rate greater than the silicon oxide.

17. A method of etching a DARC material and a hafnium aluminum oxide material in the presence of exposed silicon oxide material, the DARC material overlying and in contact with the hafnium aluminum oxide material, the method comprising:

applying an etchant solution to the DARC material and the hafnium aluminum oxide material to selectively etch the DARC material and the hafnium aluminum oxide material at a rate greater than the silicon oxide material;

wherein the etchant solution consists of phosphoric acid, water and a pH modifying acid.

18. The method of claim 17, wherein the pH modifying acid is selected from the group consisting of HCl, $H_2SO_4$, $HNO_3$, HCOOH and $CH_3COOH$.

19. The method of claim 17, wherein the phosphoric acid and water are at a ratio of about 50:50 to about 90:10 (v/v) based on the total volume of the etchant solution.

20. A method of etching a DARC material and hafnium aluminum oxide material in the presence of exposed silicon oxide material, the DARC material overlying and in contact with the hafnium aluminum oxide material, the method comprising:

applying an etchant solution to the DARC material and the hafnium aluminum oxide material to etch the DARC and hafnium aluminum oxide materials at a rate greater than the silicon oxide material;

wherein the etchant solution consists essentially of phosphoric acid, water and a pH modifying acid.

21. A method of forming a semiconductor device, comprising:

etching a hafnium aluminum oxide layer and DARC layer through a patterned photoresist mask to expose a silicon oxide layer, the DARC layer overlying and in contact with the hafnium aluminum oxide layer;

etching the silicon oxide layer to form an opening extending to a substrate;

removing the patterned photoresist mask to expose the DARC layer; and applying an etchant solution consisting essentially of phosphoric acid, water and a pH modifying acid to selectively etch the hafnium aluminum oxide and DARC layers at a rate greater than the silicon oxide.

22. The method of claim 21, further comprising, prior to etching the hafnium aluminum oxide and DARC layers, forming the hafnium aluminum oxide layer over the silicon oxide layer;

forming the DARC layer over and in contact with the hafnium aluminum oxide layer; and forming the patterned photoresist mask over the DARC layer to expose the DARC layer.

* * * * *

UNITED STATES PATENT AND TRADEMARK OFFICE
CERTIFICATE OF CORRECTION

| | |
|---|---|
| PATENT NO. | : 8,283,258 B2 |
| APPLICATION NO. | : 11/839628 |
| DATED | : October 9, 2012 |
| INVENTOR(S) | : Prashant Raghu |

It is certified that error appears in the above-identified patent and that said Letters Patent is hereby corrected as shown below:

In column 5, line 53, in Claim 4, delete "5-400" and insert -- 5-40 --, therefor.

Signed and Sealed this
Eighteenth Day of December, 2012

David J. Kappos
*Director of the United States Patent and Trademark Office*